(12) United States Patent
Yurick et al.

(10) Patent No.: US 7,508,240 B1
(45) Date of Patent: Mar. 24, 2009

(54) POWER MAINS ZERO-CROSSING DETECTOR

(75) Inventors: Benjamin Yurick, Garrettsville, OH (US); Chris Miller, Solon, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 69 days.

(21) Appl. No.: 11/784,577

(22) Filed: Apr. 6, 2007

(51) Int. Cl.
*H03K 5/153* (2006.01)
(52) U.S. Cl. ........................................................ 327/79
(58) Field of Classification Search ................ 327/79
See application file for complete search history.

(56) References Cited

U.S. PATENT DOCUMENTS 3,914,625 A * 10/1975 Billings et al. ............... 327/79
4,051,394 A * 9/1977 Tieden ....................... 327/79
5,903,172 A * 5/1999 Lee ............................ 327/79

* cited by examiner

*Primary Examiner*—Lincoln Donovan
*Assistant Examiner*—William Hernandez
(74) *Attorney, Agent, or Firm*—Pearne & Gordon LLP

(57) ABSTRACT

A zero-crossing detector includes a pair of input terminals, the terminals being adapted to receive an AC input signal; a rectifier, the rectifier rectifying the AC input signal; a current source, the current source being powered by the rectified AC input signal; and an optoelectric coupler having a coupler input and a coupler output, the coupler input being driven by the current source and the coupler output providing a zero-crossing signal. The zero-crossing signal is galvanicly isolated from the AC input signal.

3 Claims, 2 Drawing Sheets

POWER MAINS ZERO-CROSSING DETECTOR

BACKGROUND OF THE INVENTION

The present invention relates to power supplies for test instruments and, in particular to zero-crossing detectors therefor.

In high precision electrical test instruments, it is often important to determine the zero crossings of the AC power mains that power the instrument. This information is used for synchronization of the instrument, in particular for AC line noise rejection.

Referring to FIG. 1, a prior art zero-crossing detector 10 includes a pair of input terminals 12, 14 for application of an input signal from the AC mains. A rectifier 16 rectifies the AC input signal and the resulting signal is applied across a voltage divider formed by the resistors 18, 20. The voltage across the resistor 20 is applied across the light emitting diode 22A of an optoelectric coupler 22. When the diode 22A is illuminated, the phototransistor 22B of the optoelectric coupler 22 is activated. Ideally, this results in a square wave output, but a logic buffer 24, or the like, may be used to further square up and/or buffer the output signal.

In practice, it has been found that leading and trailing edges of the square wave may not correspond closely enough to the actual zero crossings of the AC mains. In particular, the error compared to the true zero crossing may exceed 100 microseconds.

SUMMARY OF THE INVENTION

A zero-crossing detector includes a pair of input terminals, the terminals being adapted to receive an AC input signal; a rectifier, the rectifier rectifying the AC input signal; a current source, the current source being powered by the rectified AC input signal; and an optoelectric coupler having a coupler input and a coupler output, the coupler input being driven by the current source and the coupler output providing a zero-crossing signal. The zero-crossing signal is galvanicly isolated from the AC input signal.

DESCRIPTION OF THE PREFERRED EMBODIMENTS

Figure 2:
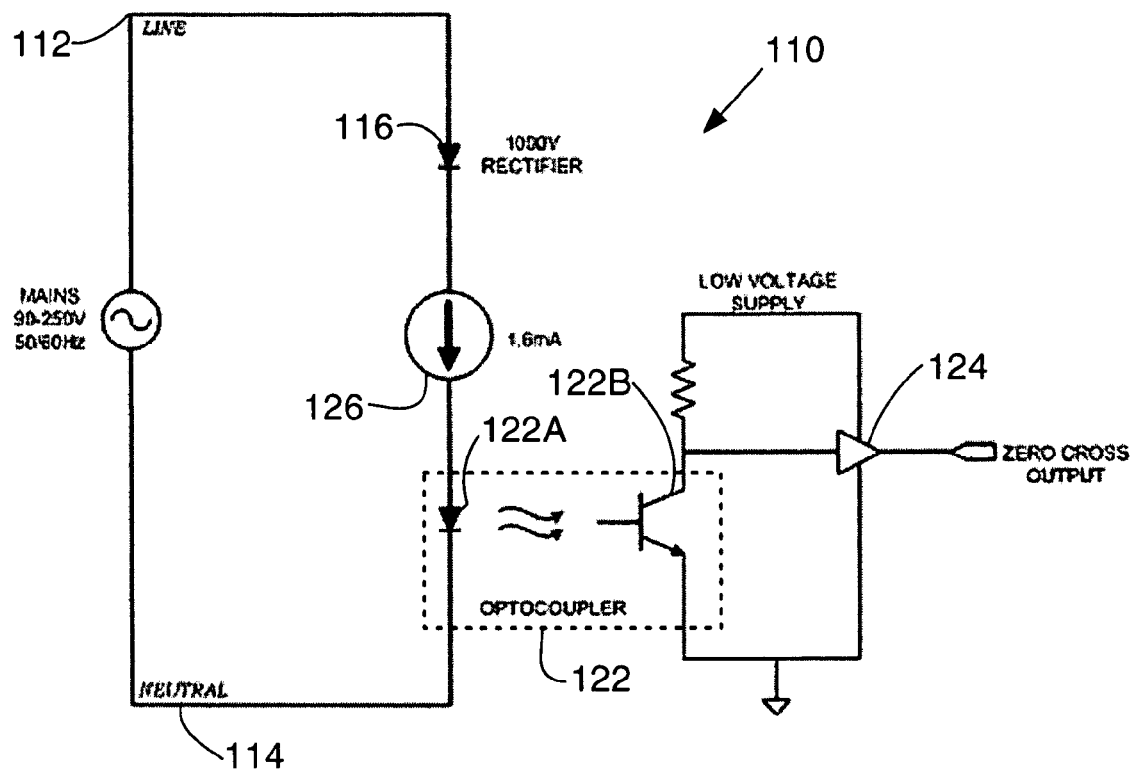
FIG. 2 is a schematic diagram of an example of a zero-crossing detector according to the invention.

Referring to FIG. 2, a zero-crossing detector 110 includes a pair of input terminals 112, 114 for application of an input signal from the AC mains. A rectifier 116 rectifies the AC input signal. The rectified AC input signal powers a current source 126 that drives a light emitting diode 122A of an optoelectric coupler 122. When the diode 122A is illuminated, the phototransistor 122B of the optoelectric coupler 122 is activated. Ideally, this results in a square wave output, but a logic buffer 124, or the like, may be used to further square up and/or buffer the output signal. This output signal is then used as a zero-crossing signal. The leading and trailing edges of this signal provide an indication of the zero crossings of the AC mains.

Figure 1:
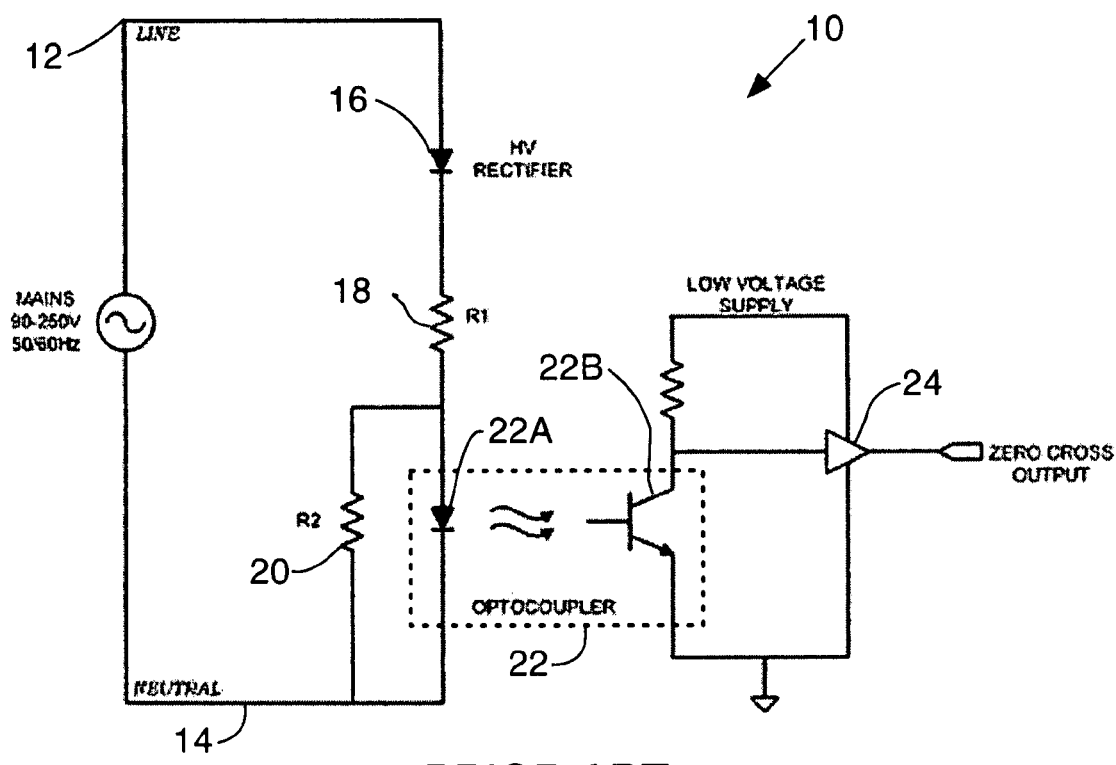
FIG. 1 is a schematic diagram of a prior art zero-crossing detector.

Unlike the detector 10 of FIG. 1, the diode 122A is driven with a constant current as long as the current source 126 has sufficient power to operate. In the detector 10, the current through the diode 22A continuously varies, making it difficult to produce a zero-crossing signal that accurately reflects the true zero crossings. This is, for example, because the diode 22A will shut off when the voltage across it drops below the diode's turn-on voltage, not when the zero crossing itself occurs In the detector 110, the constant current through the diode 122A minimizes the effect of the time difference between the true AC mains zero crossings and the time of the turn-off/turn-on voltages of the diode 122A. There is still error, but substantially less than when the resistive voltage divider circuit of the device 10 is used. For example, it is possible to have this time difference error to be less than 100 microseconds.

Figure 3:
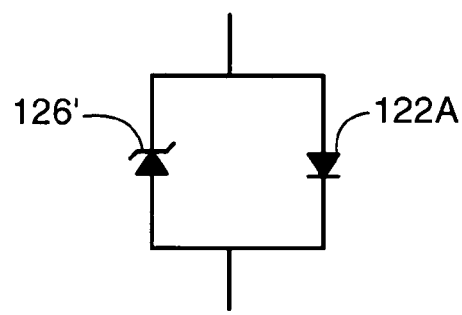
FIG. 3 is a schematic diagram of an example of an embodiment of a current source.

Referring to FIG. 3, an example of an implementation of the current source 126 is formed from a Zener diode 126' in parallel with the diode 122A. As long as the voltage across the Zener diode 126' is not below the Zener voltage, the current through the diode 122A will be constant.

It is of course possible to use other current source circuits powered from the rectified AC input signal, but the circuit of FIG. 3 has the advantage of being simple, inexpensive and physically compact.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A zero-crossing detector, said detector comprising:
   a pair of input terminals, said terminals being adapted to receive an AC input signal;
   a rectifier, said rectifier rectifying said AC input signal;
   a constant current source, said constant current source being powered by said rectified AC input signal; and
   an optoelectric coupler having a coupler input and a coupler output, said coupler input being driven by said constant current source and said coupler output providing a zero-crossing signal, said zero-crossing signal being galvanicly isolated from said AC input signal.

2. A zero-crossing detector, said detector comprising:
   a pair of input terminals, said terminals being adapted to receive an AC input signal;
   a rectifier, said rectifier rectifying said AC input signal;
   a current source, said current source being powered by said rectified AC input signal; and
   an optoelectric coupler having a coupler input and a coupler output, said coupler input being driven by said current source and said coupler output providing a zero-crossing signal, said zero-crossing signal being galvanicly isolated from said AC input signal, wherein said current source comprises a Zener diode in series relationship with said rectified AC input signal.

3. A zero-crossing detector according to claim 1, further comprising a square-wave generating circuit, said circuit ensuring that said zero-crossing signal is a square-wave.

* * * * *